United States Patent
Hashim et al.

(10) Patent No.: US 9,099,430 B2
(45) Date of Patent: Aug. 4, 2015

(54) ZRO-BASED HIGH K DIELECTRIC STACK FOR LOGIC DECOUPLING CAPACITOR OR EMBEDDED DRAM

(71) Applicant: Intermolecular, Inc., San Jose, CA (US)

(72) Inventors: Imran Hashim, Saratoga, CA (US); Xiangxin Rui, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/135,491

(22) Filed: Dec. 19, 2013

(65) Prior Publication Data

US 2015/0179730 A1    Jun. 25, 2015

(51) Int. Cl.
*H01L 21/02* (2006.01)
*H01L 49/02* (2006.01)
*H01L 27/108* (2006.01)

(52) U.S. Cl.
CPC .......... *H01L 28/40* (2013.01); *H01L 27/10805* (2013.01)

(58) Field of Classification Search
CPC .............. H01L 28/40; H01L 21/31616; H01L 21/31641; H01G 4/008

USPC ................... 257/532; 361/305, 313
See application file for complete search history.

(56) References Cited

U.S. PATENT DOCUMENTS

| | | | |
|---|---|---|---|
| 6,700,771 B2 | 3/2004 | Bhattacharyya | |
| 7,183,596 B2 | 2/2007 | Wu et al. | |
| 7,297,587 B2 | 11/2007 | Wu et al. | |
| 7,625,794 B2 | 12/2009 | Ahn et al. | |
| 7,671,394 B2 | 3/2010 | Booth, Jr. et al. | |
| 7,728,371 B2 | 6/2010 | Cheng et al. | |
| 7,728,376 B2 | 6/2010 | Matsui et al. | |
| 2003/0072126 A1 | 4/2003 | Bhattacharyya | |
| 2004/0233610 A1* | 11/2004 | Basceri et al. | 361/306.3 |
| 2005/0032302 A1* | 2/2005 | Bhat et al. | 438/240 |
| 2006/0040457 A1* | 2/2006 | Lee et al. | 438/381 |
| 2010/0172065 A1* | 7/2010 | Huang et al. | 361/313 |
| 2013/0052792 A1* | 2/2013 | Malhotra et al. | 438/396 |

* cited by examiner

*Primary Examiner* — Steven Loke
*Assistant Examiner* — Arash Majdi

(57) ABSTRACT

A zirconium oxide based dielectric material is used in the formation of decoupling capacitors employed in microelectronic logic circuits. In some embodiments, the zirconium oxide based dielectric is doped. In some embodiments, the dopant includes at least one of aluminum, silicon, or yttrium. In some embodiments, the zirconium oxide based dielectric is formed as a nanolaminate of zirconium oxide and a dopant metal oxide.

16 Claims, 9 Drawing Sheets

ZRO-BASED HIGH K DIELECTRIC STACK FOR LOGIC DECOUPLING CAPACITOR OR EMBEDDED DRAM

TECHNICAL FIELD

The present disclosure relates generally to the formation of decoupling capacitors used in microelectronic logic circuits.

BACKGROUND

The power supply on a logic chip must accommodate variations in current draw from different parts of the on-chip circuit. Typically, there is a time lag between the changes in voltage within the circuit before the power supply responds. This requirement can be met by having an on-chip metal—insulator—metal (MIM) capacitor, consisting of a high-k dielectric layer formed between bottom and top electrodes. The capacitor can be used to provide a steady source of current during the response time of the power supply. The requirements for this high-k dielectric include providing sufficient capacitance or equivalent oxide thickness (EOT) (e.g. relative to silicon dioxide) to meet the requirements for charge storage, and having sufficiently low leakage to allow charge to be stored for at least 1 ms. Furthermore, the high-k dielectric should be able to operate reliably at typical sense voltages (~1.0V) for the lifetime of the product (e.g. typically >10 years). Finally, the high-k dielectric should have a low defect density (e.g. pinhole defects or grain boundaries) which can be a source of leakage or charge loss in these capacitors. The defect density places an upper limit on the size of the capacitor that can be used in a chip. In some cases, the capacitor is divided into smaller capacitors which are connected in parallel to minimize the occurrence of these pinhole or grain boundary defects.

There is a need to develop dielectric materials and MIM capacitor stacks that meet these requirements as decoupling capacitors for advanced and future logic circuits.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, a zirconium oxide based dielectric material is used in the formation of decoupling capacitors employed in microelectronic logic circuits. In some embodiments, the zirconium oxide based dielectric is doped. In some embodiments, the dopant includes at least one of aluminum, silicon, or yttrium. In some embodiments, the zirconium oxide based dielectric is formed as a nanolaminate of zirconium oxide and a dopant metal oxide.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
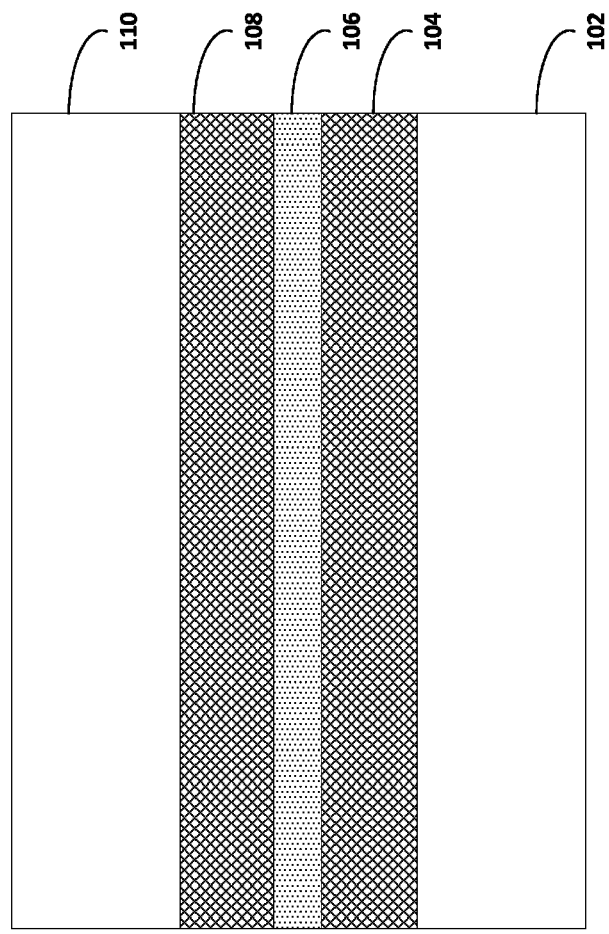
FIG. 1 illustrates a simplified cross-sectional view of semiconductor layer stacks fabricated in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" may also include two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

The discussion herein will use a simple capacitor stack as an illustration. The capacitor stack will include a first electrode layer (sometimes called a bottom electrode layer), a dielectric layer, and a second electrode layer (sometimes called a top electrode layer). Those skilled in the art will understand that each of the first electrode layer, dielectric layer, and second electrode layer may include multiple layers and multiple materials. In some embodiments, an additional layer will be inserted between the first electrode layer and the dielectric layer. As used herein, this layer will be labeled a "flash" layer. In some embodiments, an additional layer will be inserted between the dielectric layer and the second electrode layer. As used herein, this layer will be labeled a "capping" layer. The terms "first", "bottom", "second", "top", "flash", "capping", etc. are included for convenience and to assist in the description of the capacitor stack and are not meant to be limiting.

As used herein, a material (e.g. a dielectric material or an electrode material) will be considered to be "crystalline" if it exhibits greater than or equal to 30% crystallinity as measured by a technique such as x-ray diffraction (XRD).

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the dielectric material comprise annealing time, annealing temperature, film thickness, etc. For a certain class of dopants, as the concentration of the dopant is increased, the crystallization temperature of the dielectric material increases.

The term "nanolaminate", as used herein, will be understood to be defined as a material or layer that is formed from the deposition of a plurality of sub-layers. Typically, the sub-layers include different materials and the different sub-layers are alternated in a predetermined ratio of thicknesses and/or compositions.

As used herein, the phrase "high k" will be understood to refer to a material and/or layer that has a dielectric constant of greater than 7.

As used herein, the phrase "high band gap" will be understood to refer to a material and/or layer that has a band gap of greater than 4 eV.

Those skilled in the art will appreciate that each of the layers discussed herein and used in the decoupling MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex topology of the decoupling capacitor structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

Figure 2:
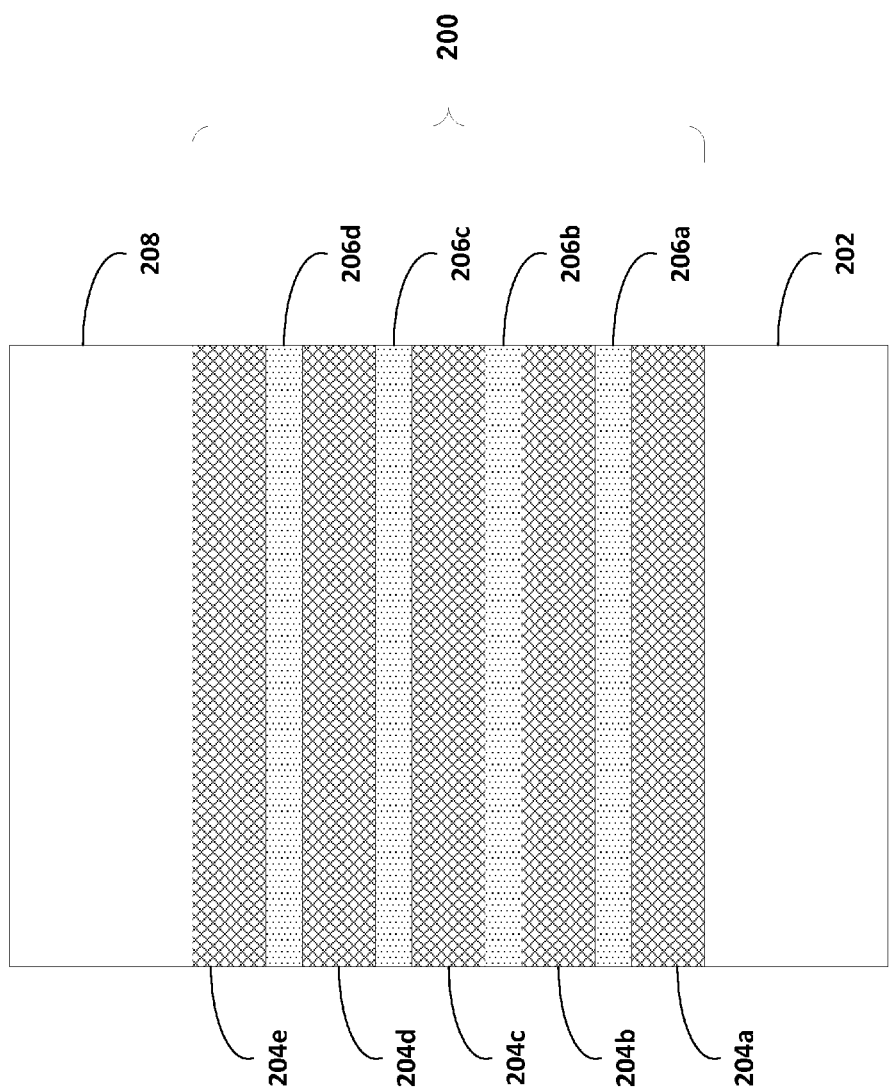
FIG. 2 illustrates a simplified cross-sectional view of semiconductor layer stacks fabricated in accordance with some embodiments.

In FIGS. 1 and 2, a capacitor stack is illustrated using a simple planar structure. Those skilled in the art will appreciate that the description and teachings herein can be readily applied to any simple or complex capacitor morphology. The drawings are for illustrative purposes only and do not limit the application of the present disclosure.

Hafnium oxide is a high k (e.g. k value ~25) dielectric material that has been evaluated for applications such as a gate dielectric material or as a capacitor dielectric material. One application of hafnium oxide is as the dielectric material in decoupling capacitors used in logic circuits. In some embodiments, two layers of hafnium oxide are formed on either side of an aluminum oxide layer to form a dielectric stack. Typically, the two hafnium oxide layers are crystalline. Typically, the aluminum oxide layer is amorphous. The two hafnium oxide layers contribute to the high k value of the dielectric stack, while the aluminum oxide layer suppresses the leakage current through the dielectric stack.

Leakage current in dielectric materials can be due to mechanisms such as Schottky emission, Frenkel-Poole defects (e.g. oxygen vacancies ($V_{ox}$) or grain boundaries), or Fowler-Nordheim tunneling, and the like. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling at high enough electric fields. As such, the Fowler-Nordheim emission behavior of a dielectric layer is generally determined by the physical thickness of the dielectric layer and the voltage applied. This leakage current is a primary driving force in the adoption of high-k dielectric materials. The use of high-k materials allows the physical thickness of the dielectric layer to be as thick as possible, thus suppressing the tunneling current, while maintaining the required capacitance.

Lightly or non-doped dielectric materials, such as zirconium oxide, wherein the dopant concentration is low, will generally be crystalline after being annealed at 550 C for 5 minutes, and will exhibit high k-values, but typically also exhibit higher leakage current. The degree of crystallinity also depends upon the dielectric thickness, with the crystallinity decreasing with dielectric thickness. As used herein, a dielectric material will be considered to be crystalline if it exhibits greater than or equal to 30% crystallinity as measured by a technique such as x-ray diffraction (XRD) after an anneal step. The higher leakage current is partly due to leakage along the grain boundaries due to the Frenkel-Poole mechanism discussed earlier. Conversely, highly doped dielectric materials, such as zirconium oxide, wherein the appropriate dopant concentration is sufficiently high, will generally be amorphous after being annealed at 550 C for 5 minutes, and will exhibit lower k-values, but will also exhibit low leakage current. Typically, dielectric materials, such as zirconium oxide, that are doped to dopant levels above about 10 to 15 atomic % will remain amorphous after the typical anneal steps used in the fabrication of logic devices. However, this will vary depending on the dielectric material, the dopant, and the details of the annealing step and is not intended to be limiting. The properties of these two types of dielectric materials may be combined to concurrently meet the EOT (a function of the k-value) and the leakage current targets for advanced logic technologies.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the decoupling capacitor to maintain sufficiently high barrier height between the electrode and the dielectric. Metals, such as platinum, gold, ruthenium, and ruthenium oxide are examples of high work function electrode materials suitable for inhibiting leakage in a decoupling capacitor having a high-k dielectric material. The noble metal systems, however, are prohibitively expensive when employed in a mass production context. Moreover, electrodes fabricated from noble metals often suffer from poor manufacturing qualities, such as surface roughness and poor adhesion, and form a contamination risk in the fab.

Additionally, decoupling capacitor stacks may undergo various refinement process steps after fabrication. These refinement processes may include post-fabrication chemical and thermal processing (i.e., oxidation or reduction). For instance, after initial decoupling capacitor stack fabrication, a number of high temperature (up to about 600 C) processes may be applied to complete the device fabrication. During these subsequent process steps, the decoupling capacitor materials must remain chemically, physically, and structurally stable. They must maintain the structural, compositional, physical, and electrical properties that have been developed for optimal device properties. Furthermore, they should not undergo significant interaction or reaction which may degrade the performance of the decoupling capacitor.

FIG. 1 illustrates a simplified cross-sectional view of decoupling capacitor stacks fabricated in accordance with some embodiments. A first hafnium oxide layer, 104, is formed above a bottom electrode, 102, of a decoupling capacitor. Examples of suitable electrode materials include metals, metal alloys, conductive metal oxides, conductive metal silicides, conductive metal nitrides, doped polysilicon, or combinations thereof. Examples of suitable materials for the bottom electrode layer include titanium nitride, titanium aluminum nitride, titanium silicon nitride, tantalum nitride, tantalum aluminum nitride, tantalum silicon nitride, doped polysilicon, or combinations thereof. First hafnium oxide layer, 104, typically has a thickness between 2 nm and 5 nm. Typically, first hafnium oxide layer, 104, will become crystalline during a subsequent anneal step.

Aluminum oxide layer, 106, is formed above the first hafnium oxide layer, 104. Aluminum oxide layer, 106, typically has a thickness between 0.3 nm and 1.0 nm. Aluminum oxide layer, 106, will remain amorphous during a subsequent anneal step.

A second hafnium oxide layer, 108, is formed above aluminum oxide layer, 106. Second hafnium oxide layer, 108, typically has a thickness between 2 nm and 5 nm. Typically, second hafnium oxide layer, 108, will become crystalline during a subsequent anneal step.

Top electrode layer, 110, is formed above second hafnium oxide layer, 108. Examples of suitable electrode materials include metals, metal alloys, conductive metal oxides, conductive metal silicides, conductive metal nitrides, doped polysilicon, or combinations thereof. Examples of suitable materials for the top electrode layer include titanium nitride, titanium aluminum nitride, titanium silicon nitride, tantalum nitride, tantalum aluminum nitride, tantalum silicon nitride, doped polysilicon, or combinations thereof.

FIG. 2 illustrates a simplified cross-sectional view of decoupling capacitor stacks fabricated in accordance with some embodiments. A dielectric layer, 200, is formed above a bottom electrode, 202, of a decoupling capacitor. Examples of suitable electrode materials include metals, metal alloys, conductive metal oxides, conductive metal silicides, conductive metal nitrides, doped polysilicon, or combinations thereof. Examples of suitable materials for the bottom electrode layer include titanium nitride, titanium aluminum nitride, titanium silicon nitride, tantalum nitride, tantalum aluminum nitride, tantalum silicon nitride, doped polysilicon, or combinations thereof.

In some embodiments, dielectric layer, 200, is formed as a nanolaminate of a high k material (e.g. 204a-204e) and a high band gap material (e.g. 206a-206d). In FIG. 2, five sub-layers of the high k material have been illustrated and four sub-layers of the high band gap material have been illustrated. Those skilled in the art will understand that any number and ratio of sub-layers may be employed to form a dielectric layer with the desired thickness and composition. The number of sub-layers illustrated in FIG. 2 are not limiting. Dielectric layer, 200, typically has a thickness between 6 nm and 10 nm. Typically, dielectric layer, 200, will remain amorphous during a subsequent anneal step.

Top electrode layer, 208, is formed above dielectric layer, 200. Examples of suitable electrode materials include metals, metal alloys, conductive metal oxides, conductive metal silicides, conductive metal nitrides, doped polysilicon, or combinations thereof. Examples of suitable materials for the top electrode layer include titanium nitride, titanium aluminum nitride, titanium silicon nitride, tantalum nitride, tantalum aluminum nitride, tantalum silicon nitride, doped polysilicon, or combinations thereof.

In some embodiments, dielectric layer, 200, is formed from zirconium oxide or titanium oxide (e.g. a high k material) and aluminum oxide (e.g. a high band gap material). Other high band gap materials include silicon oxide, lanthanum oxide, or yttrium oxide. Typically, each of the sub-layers (e.g. 204a-e and 206a-d) will remain amorphous during a subsequent anneal step. This is due to the small thickness of the sub-layers (e.g. thin layers are harder to crystallize) and due to the high doping concentration of the high band gap material into the high k material (typically greater than 15 atomic %).

Figure 3:
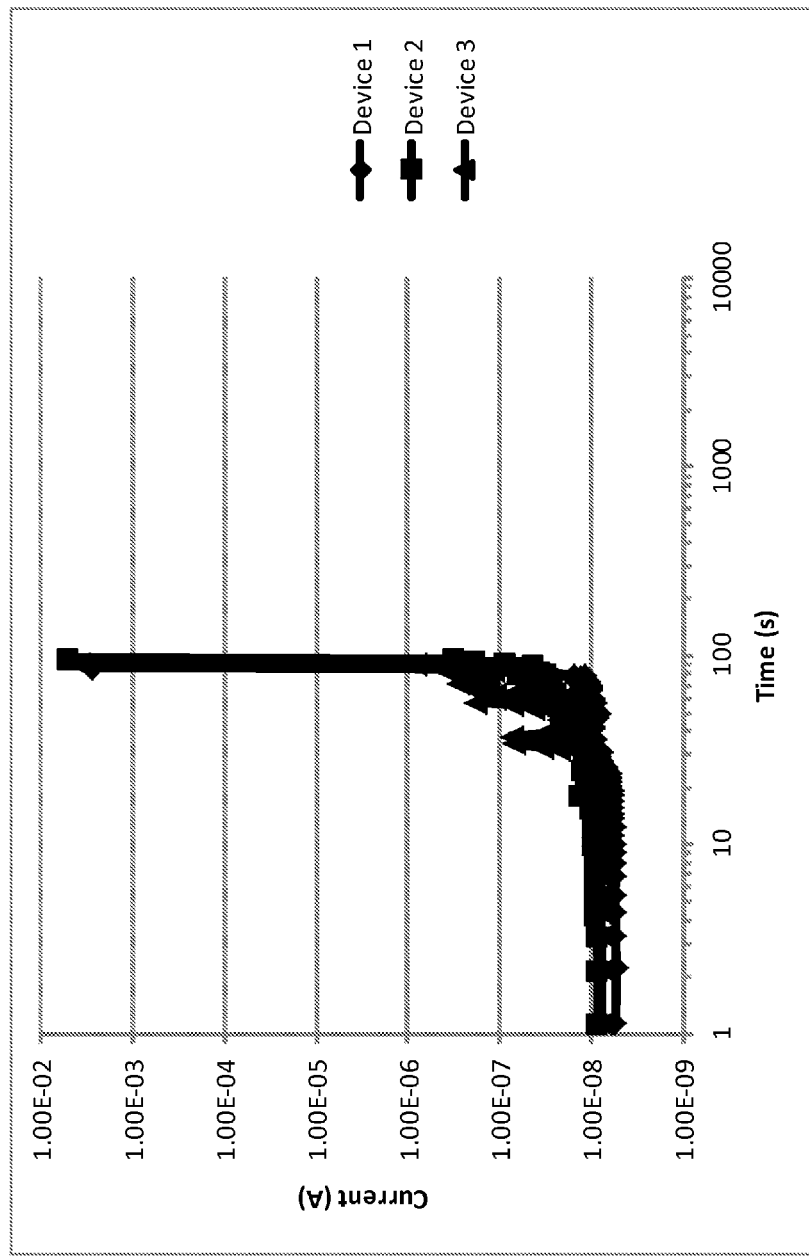
FIG. 3 presents data for current versus time under constant voltage stress for a capacitor stack according to some embodiments.

FIG. 3 presents data for current versus time under constant voltage stress for a capacitor stack according to some embodiments. Data are presented for three devices (e.g. two-terminal capacitor devices). The devices included a hafnium oxide—aluminum oxide—hafnium oxide dielectric stack with a thickness of 1.6 nm. The bottom and top electrodes were each titanium nitride. Each device was stressed at 3.7V and the current was measured as a function of time. The data indicate that each of the devices begins to show an increase in the measured current and instability in the measured current in the range of about 30 to about 90 seconds, but the leakage is still not significantly higher, and is reversible. For the purpose of this disclosure, this behavior will be defined as "soft breakdown". The data also indicate that all three devices exhibit hard breakdown within 100 seconds with an irreversible high surge of current. Without being limited by theory, it is believed that the soft breakdown behavior may be attributed to leakage along the grain boundaries present in the crystalline hafnium oxide layers. The soft breakdown behavior may result in errors during the application of sense voltages, even before the device has failed completely.

Figure 4:
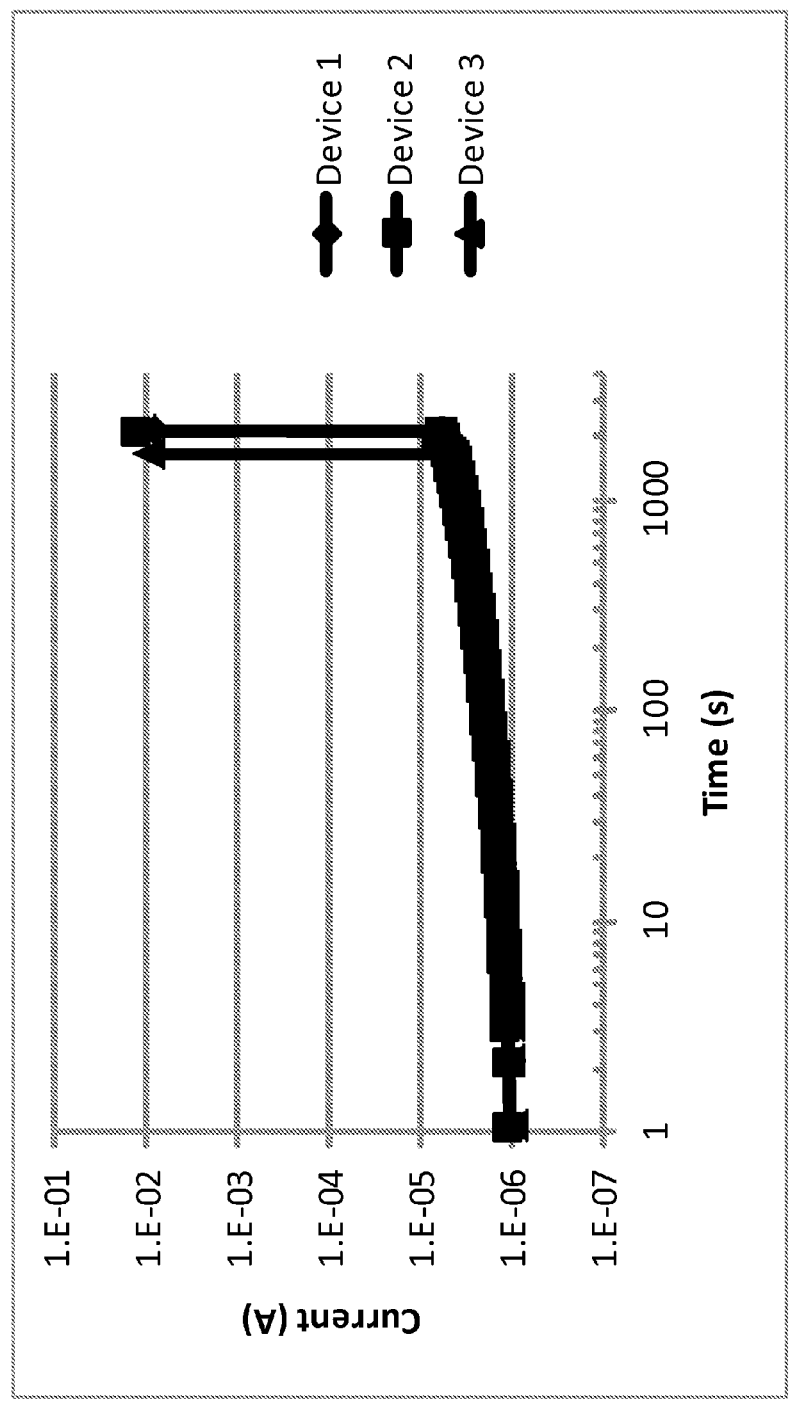
FIG. 4 presents data for current versus time under constant voltage stress for a capacitor stack according to some embodiments.

FIG. 4 presents data for current versus time under constant voltage stress for a capacitor stack according to some embodiments. Data are presented for three devices (e.g. two-terminal capacitor devices). The devices included a zirconium oxide—aluminum oxide—nanolaminate dielectric stack with a thickness of 1.4 nm (e.g. thinner than the devices in FIG. 3). The bottom and top electrodes were each titanium nitride. Each device was stressed at 3.9V (e.g. a higher stress voltage than used for testing the devices in FIG. 3) and the current was measured as a function of time. The data also indicate that all three devices exhibit hard breakdown at between about 500 and about 2000 seconds. The data indicate that there is no "soft breakdown" behavior observed in these three devices. Without being limited by theory, it is believed that the lack of soft breakdown behavior may be attributed to the fact that the entire dielectric stack remained amorphous and there were no grain boundaries present to provide leakage paths believed to be associated with soft breakdown behavior.

Figure 5:
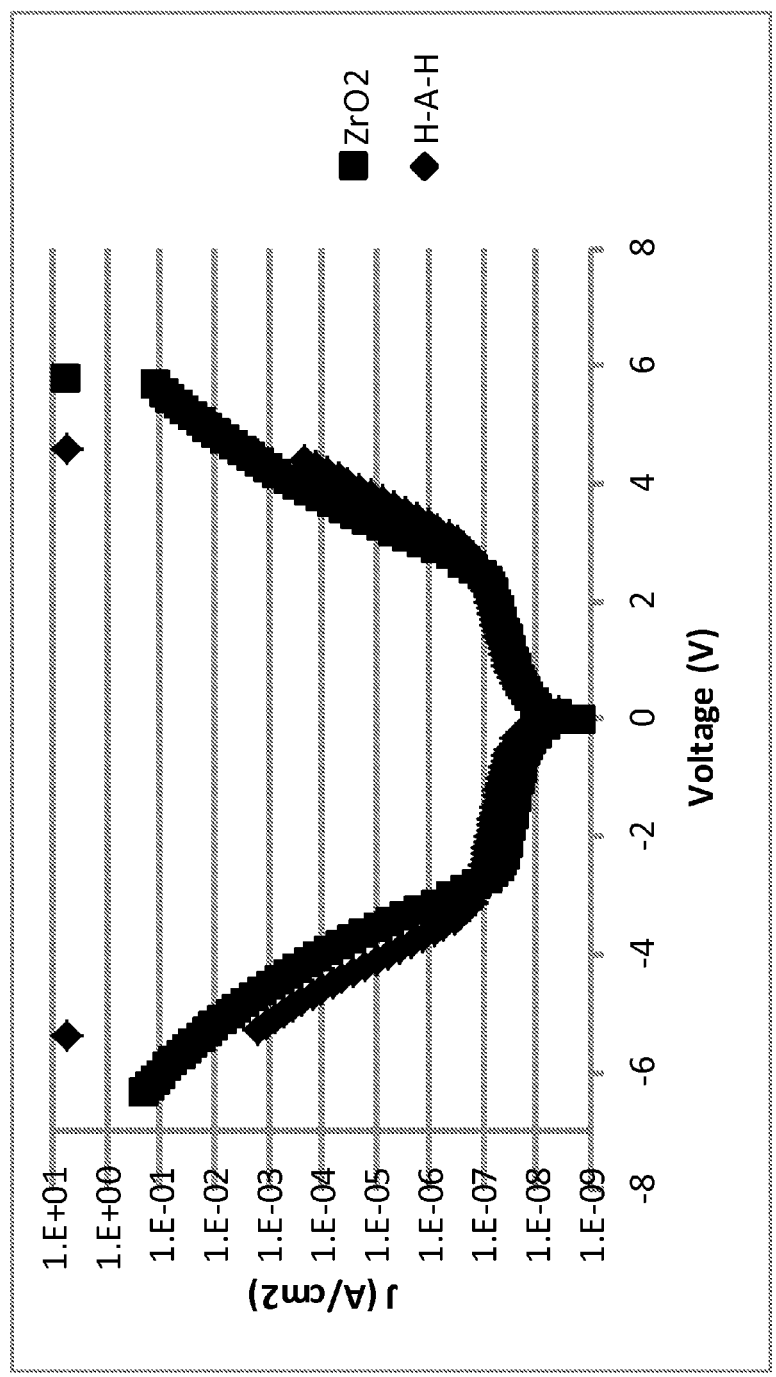
FIG. 5 presents data for current density versus voltage for capacitor stacks according to some embodiments.

FIG. 5 presents data for current density versus voltage for capacitor stacks according to some embodiments. The breakdown voltage (Vbd) of a dielectric stack is defined as the voltage at which there is a large (e.g. several orders of magnitude) increase in current. At this voltage, the device is effectively destroyed. Capacitors were formed with different dielectric stacks, but with similar EOT values of about 1.4 nm. The data indicate that the Vbd for the capacitors formed with a zirconium oxide—aluminum oxide—nanolaminate dielectric stack (indicated by the square data symbols—"ZrO2") is higher than the Vbd for the capacitors formed with a hafnium oxide—aluminum oxide—hafnium oxide dielectric stack (indicated by the diamond data symbols—"H-A-H"). This trend is true when the voltage is swept in either the positive or negative direction. The "ZrO2" dielectric stack will exhibit improved device performance compared to the "H-A-H" stack when implemented as a dielectric material used in decoupling capacitors.

Figure 6:
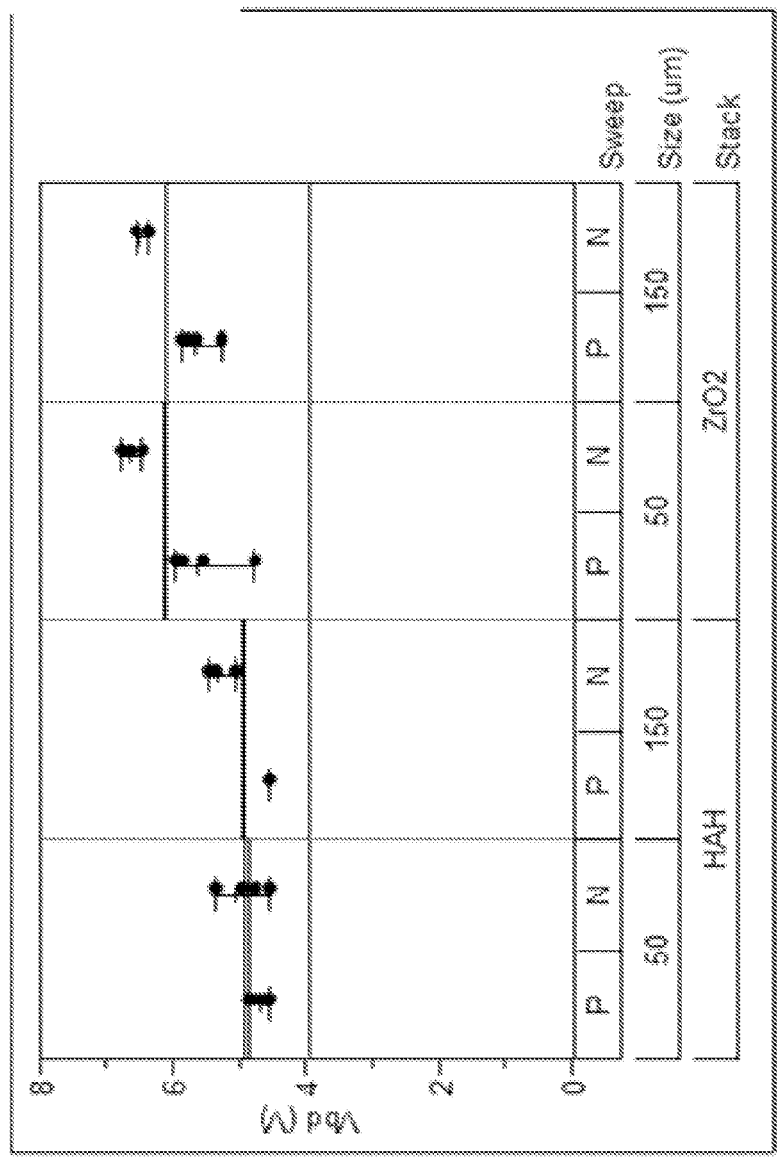
FIG. 6 presents box plot data for breakdown voltage versus sweep, size, and stack for various capacitor stacks according to some embodiments.

FIG. 6 presents box plot data for breakdown voltage (Vbd) versus sweep, size, and stack for various capacitor stacks according to some embodiments. Each of the sets of data represents the results of measurements made on six devices. Data were collected for two dielectric stacks, a hafnium oxide—aluminum oxide—hafnium oxide dielectric stack (indicated by the "HAH" designation in the "Stack" row), and a zirconium oxide—aluminum oxide—nanolaminate dielectric stack (indicated by the "ZrO2" designation in the "Stack" row). For each of the types of stacks, data were collected for two device sizes, 50 and 150 um diameter, as indicated in the "Size" row. For each of the types of stacks, and for each device size, data were collected with the voltage swept in the positive direction (indicated by the "P" designation in the "Sweep" row), and in the negative direction (indicated by the "N" designation in the "Sweep" row). The data indicate that for each type of dielectric stack, the data are generally tightly distributed. This confirms that the behavior is consistent and repeatable. The data indicate that for each type of dielectric stack, the Vbd when the voltage is swept in the negative direction is higher than the Vbd when the voltage is swept in the positive direction. This could be caused by interaction of the high k dielectric deposition (especially the oxidant used) with the bottom electrode, resulting in an asymmetric I-V response. This trend is more apparent for the "ZrO2" dielectric stacks. The data indicate that the Vbd is higher for the "ZrO2" stacks versus the "HAH" stacks for all device sizes and for both sweeping polarities. The "ZrO2" dielectric stack will exhibit improved device performance compared to the "HAH" stack when implemented as a dielectric material used in decoupling capacitors.

It is advantageous to form the high k film (e.g. zirconium oxide) so as to reduce the number of defects (e.g. oxygen vacancies and/or contaminants). As discussed previously, this will reduce the leakage current through the capacitor. One method used to form the high k material employs ALD for the deposition. As is well known in the art, ALD formation of a metal oxide includes alternating cycles of a metal precursor and an oxidant, typically with an inert gas purge between cycles. Common metal precursors include metal organic compounds and/or metal amine compounds. Common oxidants include water, oxygen, ozone, nitrous oxide, hydrogen peroxide, and the like.

Figure 7:
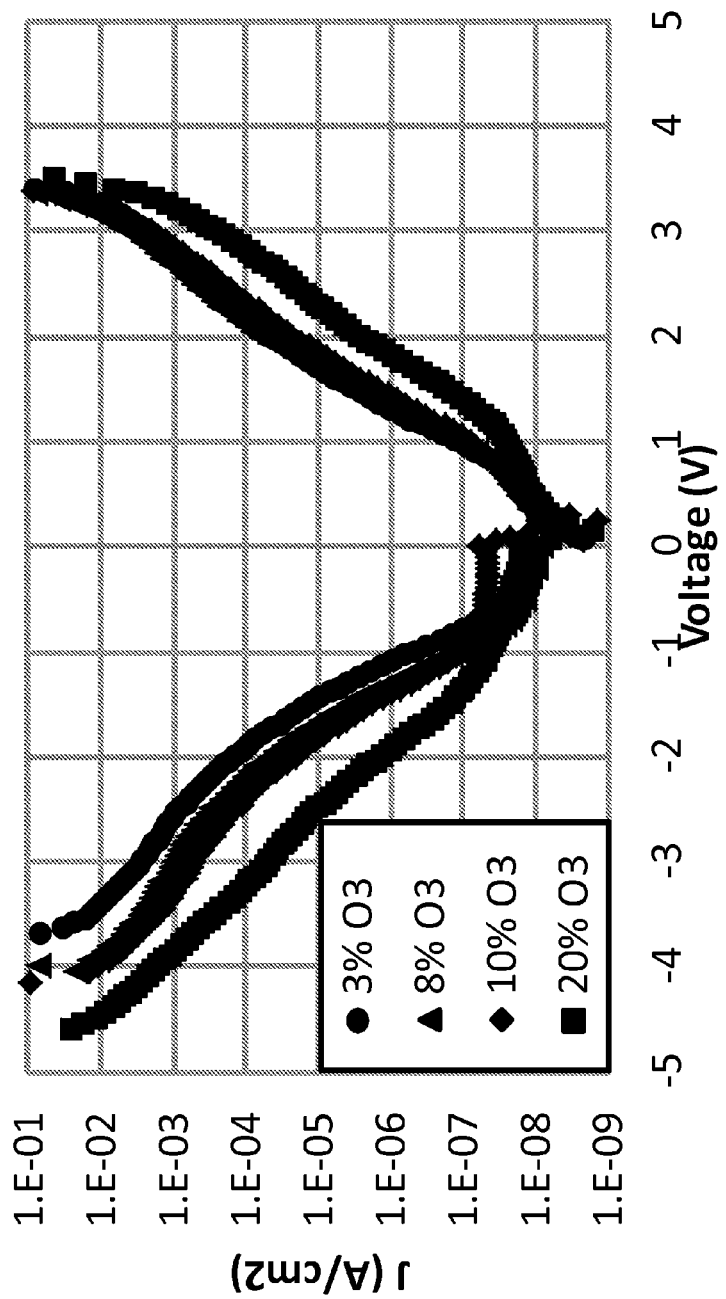
FIG. 7 presents data for current density versus voltage for capacitor stacks according to some embodiments.

As discussed previously, ozone is a common oxidant used in the formation of metal oxide dielectric materials. Ozone is typically delivered as a diluent within an oxygen stream. The concentration of ozone can be controlled between 0 and 20 weight %. At higher ozone concentrations, the number of oxygen vacancies within the deposited metal oxide material is expected to be lower, as there is sufficient oxygen to fully oxidize the zirconium to zirconium dioxide. FIG. 7 presents data for current density versus voltage for capacitor stacks according to some embodiments. Zirconium oxide films were deposited at a thickness of about 68 A using several different ozone concentrations for the oxidant pulse during the ALD deposition. Titanium nitride was used for both the bottom electrode and the top electrode. The data for the zirconium oxide deposited using 3 weight % ozone are indicated by the circle symbols. The data for the zirconium oxide deposited using 8 weight % ozone are indicated by the triangle symbols. The data for the zirconium oxide deposited using 10 weight % ozone are indicated by the diamond symbols. The data for the zirconium oxide deposited using 20 weight % ozone are indicated by the square symbols.

The data in FIG. 7 indicate that generally, the current density is higher when the voltage is swept in the negative direction. This is true for all of the data sets. The data indicate that the current density is higher for zirconium oxide layers deposited using 3 weight % ozone as the oxidant during the ALD deposition. The data indicate that the current density is lower for zirconium oxide layers deposited using 20 weight % ozone as the oxidant during the ALD deposition. The zirconium oxide dielectric stack will exhibit improved device performance when deposited using 20 weight % ozone as the oxidant when implemented as a dielectric material used in decoupling capacitors.

Figure 8:
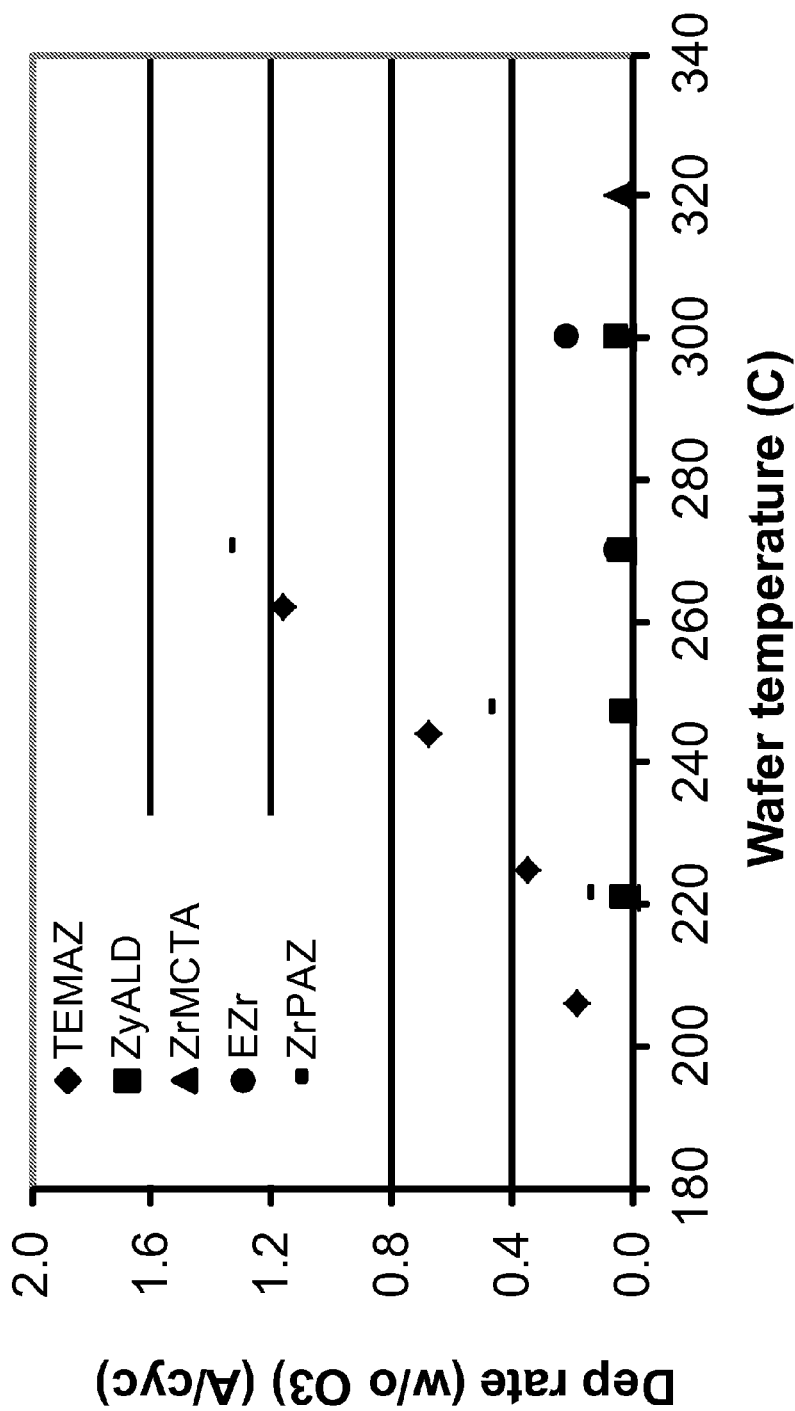
FIG. 8 presents data for deposition rate versus wafer temperature for zirconium precursors according to some embodiments.

To further reduce the number of defects within the dielectric material, it is advantageous to use precursors that have high thermal stability. This will decrease the concentration of contaminants such as carbon that are introduced through the decomposition of the precursor ligands. FIG. 8 presents data for deposition rate versus wafer temperature for zirconium precursors according to some embodiments. These data were collected by exposing the substrate to repeated pulses of the precursor, without the introduction of an oxidant. Therefore, any measured deposition on the substrate is due to the decomposition of the precursor and not the reaction of the precursor with an oxidant. The pulses were typically seven seconds in length. The substrate was typically exposed to 50 repeated pulses.

The data in FIG. 8 compare the decomposition of five zirconium precursors. "TEMAZ" (i.e. tetrakis(ethylmethylamido)zirconium) is a commercially available zirconium precursor used in the deposition of zirconium-based material using ALD. "ZyALD" (i.e. tris(dimethylamino)cyclopentadienylzirconium) is a trademarked zirconium precursor offered by Air Liquide. "ZrMCTA" (i.e. Tris(dimethylamino) methylcyclopentadienylzirconium) is a commercially available zirconium precursor used in the deposition of zirconium-based material using ALD. "EZr" (i.e.) is a commercially available zirconium precursor from ATMI used in the deposition of zirconium-based material using ALD. "ZrPAZ" (i.e.) is a commercially available zirconium precursor from Tosoh used in the deposition of zirconium-based material using ALD.

The data for the TEMAZ precursor (i.e. illustrated by the diamond symbols) indicate that this precursor begins to decompose at substrate temperatures of greater than about 220 C. The data for the ZyALD precursor (i.e. illustrated by the square symbols) indicate that this precursor begins to decompose at substrate temperatures of greater than about 260 C. The data for the ZrMCTA precursor (i.e. illustrated by the triangle symbols) indicate that this precursor begins to decompose at substrate temperatures of greater than about 280 C. The data for the EZr precursor (i.e. illustrated by the circle symbols) indicate that this precursor begins to decompose at substrate temperatures of greater than about 270 C. The data for the ZrPAZ precursor (i.e. illustrated by the dash symbols) indicate that this precursor begins to decompose at substrate temperatures of greater than about 220 C. These data indicate that the decomposition temperatures of the TEMAZ and the ZrPAZ are too low and would likely result in the deposition of zirconium oxide films with increased concentrations of carbon and an increased number of defects. These data indicate that ZrMCTA and ZyALD are promising candidates as zirconium ALD precursors.

Figure 9:
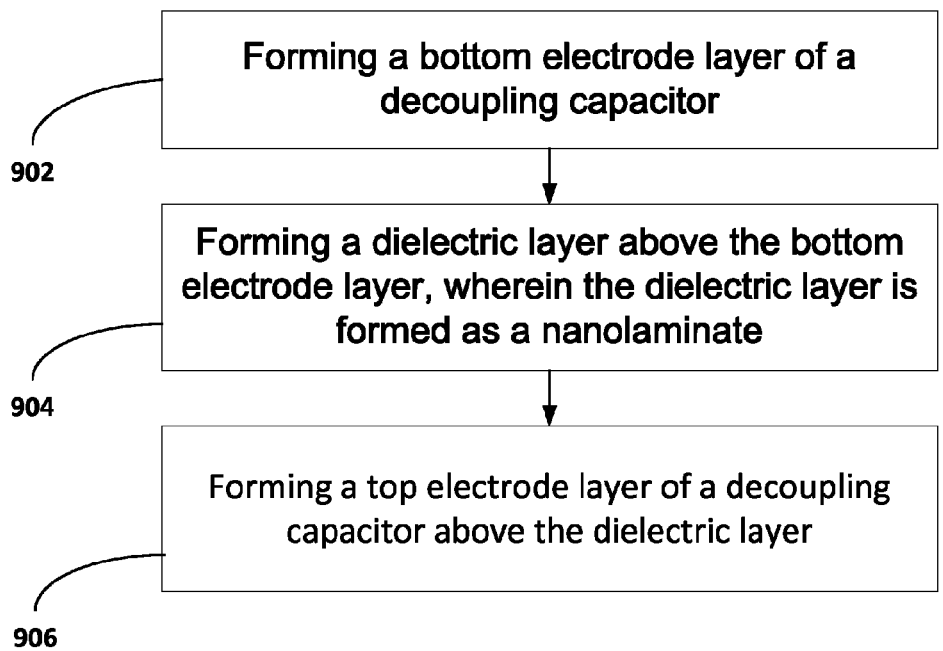
FIG. 9 illustrates a flow chart describing methods for fabricating capacitor stacks in accordance with some embodiments.

FIG. 9 illustrates a flow chart describing methods for fabricating capacitor stacks in accordance with some embodiments. In step 902, a bottom electrode layer of a decoupling capacitor is formed above a surface of a substrate. Typically, the substrate includes logic circuits formed (either completely or in progress) thereon. Examples of suitable electrode materials include metals, metal alloys, conductive metal oxides, conductive metal silicides, conductive metal nitrides, doped polysilicon, or combinations thereof. Examples of suitable materials for the top electrode layer include titanium nitride, titanium aluminum nitride, titanium silicon nitride, tantalum nitride, tantalum aluminum nitride, tantalum silicon nitride, doped polysilicon, or combinations thereof.

In step 904, a dielectric layer if formed above the bottom electrode layer. In some embodiments, the dielectric layer is formed as a nanolaminate of a high k material and a high band gap material. In some embodiments, the high k material includes zirconium oxide. In some embodiments, the high band gap material includes aluminum oxide, silicon oxide, lanthanum oxide, or yttrium oxide.

In step 906, a top electrode layer of a decoupling capacitor is formed above the dielectric layer. Typically, the substrate includes logic circuits formed (either completely or in progress) thereon. The decoupling capacitor can be formed in the backend of the logic processing steps (e.g. between the upper metal interconnect layers). Examples of suitable electrode materials include metals, metal alloys, conductive metal oxides, conductive metal silicides, conductive metal nitrides, doped polysilicon, or combinations thereof. Examples of suitable materials for the top electrode layer include titanium nitride, titanium aluminum nitride, titanium silicon nitride, tantalum nitride, tantalum aluminum nitride, tantalum silicon nitride, doped polysilicon, or combinations thereof.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A capacitor comprising:
    a bottom electrode layer disposed above a surface of a substrate;
    a dielectric stack disposed above the bottom electrode layer, wherein the dielectric stack comprises a nanolaminate of a high k material sub-layer and a high band gap material sub-layer, wherein the high k material sub-layer is formed by ALD deposition, wherein ozone having a concentration of 20 weight % is used as an oxidant during the ALD deposition,
    wherein the high k material sub-layer is amorphous,
    wherein the high band gap material sub-layer is amorphous; and a top electrode layer above disposed the dielectric stack.

2. The capacitor of claim 1, wherein the bottom electrode layer comprises one or more of titanium nitride, titanium aluminum nitride, titanium silicon nitride, tantalum nitride, tantalum aluminum nitride, tantalum silicon nitride, or doped polysilicon.

3. The capacitor of claim 1, wherein the bottom electrode layer comprises titanium nitride.

4. The capacitor of claim 1, wherein the high k material comprises zirconium oxide.

5. The capacitor of claim 1, wherein the high band gap material comprises at least one of silicon oxide, lanthanum oxide, or yttrium oxide.

6. The capacitor of claim 1, wherein the top electrode layer comprises one or more of titanium nitride, titanium aluminum nitride, titanium silicon nitride, tantalum nitride, tantalum aluminum nitride, tantalum silicon nitride, or doped polysilicon.

7. The capacitor of claim 1, wherein the top electrode layer comprises titanium nitride.

8. The capacitor of claim 1, wherein the dielectric stack further comprises an additional high k material sub-layer, and wherein the high band gap material sub-layer is disposed between the high k material sub-layer and the additional high k material sub-layer.

9. The capacitor of claim 1, wherein the high k material sub-layer further comprises a dopant selected from the group consisting of aluminum, silicon, or yttrium.

10. A method of forming a capacitor for use in a microelectronic logic circuit, the method comprising:
    forming a bottom electrode layer above a surface of a substrate;
    forming a dielectric stack above the bottom electrode layer, wherein forming the dielectric stack comprises forming a nanolaminate of a high k material sub-layer and a high band gap material sub-layer, wherein the high k material sub-layer is formed by ALD deposition, wherein ozone having a concentration of 20 weight % is used as an oxidant during the ALD deposition,
    wherein the high k material sub-layer is amorphous, and
    wherein the high band gap material sub-layer is amorphous; and forming a top electrode layer above the dielectric stack.

11. The method of claim 10, wherein the bottom electrode layer comprises one or more of titanium nitride, titanium aluminum nitride, titanium silicon nitride, tantalum nitride, tantalum aluminum nitride, tantalum silicon nitride, or doped polysilicon.

12. The method of claim 10, wherein the bottom electrode layer comprises titanium nitride.

13. The method of claim 10, wherein the high k material comprises zirconium oxide.

14. The method of claim 10, wherein the high band gap material comprises at least one of silicon oxide, lanthanum oxide, or yttrium oxide.

15. The method of claim 10, wherein the top electrode layer comprises one or more of titanium nitride, titanium aluminum nitride, titanium silicon nitride, tantalum nitride, tantalum aluminum nitride, tantalum silicon nitride, or doped polysilicon.

16. The method of claim 10, wherein the top electrode layer comprises titanium nitride.

* * * * *